United States Patent
Dorfman

(10) Patent No.: US 9,303,828 B2
(45) Date of Patent: Apr. 5, 2016

(54) FLEXIBLE WHITE REFLECTIVE DIELECTRIC FOR ELECTRONIC CIRCUITS

(71) Applicant: E I DU PONT DE NEMOURS AND COMPANY, Wilmington, DE (US)

(72) Inventor: Jay Robert Dorfman, Durham, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/326,836

(22) Filed: Jul. 9, 2014

(65) Prior Publication Data

US 2015/0038638 A1    Feb. 5, 2015

Related U.S. Application Data

(60) Provisional application No. 61/860,293, filed on Jul. 31, 2013.

(51) Int. Cl.

| | |
|---|---|
| *C08L 75/04* | (2006.01) |
| *C08L 75/06* | (2006.01) |
| *C08L 71/12* | (2006.01) |
| *C08K 3/22* | (2006.01) |
| *F21K 99/00* | (2010.01) |
| *H01B 3/30* | (2006.01) |
| *H03K 17/96* | (2006.01) |
| *C09D 175/04* | (2006.01) |
| *H05K 3/28* | (2006.01) |
| *F21Y 101/02* | (2006.01) |

(52) U.S. Cl.
CPC . *F21K 9/50* (2013.01); *C08L 71/12* (2013.01); *C08L 75/04* (2013.01); *C09D 175/04* (2013.01); *F21K 9/30* (2013.01); *H01B 3/302* (2013.01); *H01B 3/307* (2013.01); *H03K 17/962* (2013.01); *H05K 3/285* (2013.01); *F21Y 2101/02* (2013.01); *H03K 2217/960705* (2013.01); *H03K 2217/960755* (2013.01); *H05K 2201/2054* (2013.01)

(58) Field of Classification Search
CPC ......... C08L 71/12; C08L 75/04; C08L 75/06; C08K 2003/2227; C08K 2003/2241
See application file for complete search history.

(56) References Cited

U.S. PATENT DOCUMENTS

| | | | |
|---|---|---|---|
| 6,083,606 A * | 7/2000 | Okada | B24B 21/00 428/143 |
| 2013/0068512 A1 | 3/2013 | Dorfman et al. | |

FOREIGN PATENT DOCUMENTS

| | | |
|---|---|---|
| JP | 2010/031297 A | 2/2010 |
| JP | 2013/053243 A | 3/2013 |
| WO | 2012/141124 A1 | 10/2012 |

OTHER PUBLICATIONS

Google Translation of WO 2012/141124 A1 to Nishio et al.*
Xu et al. Journal of Polymer Science Part A: Polymer Chemistry, 2010, 48(9), 1931-1942.*
EL 1179WOPCT (International Search Report and Written Opinion) PCT/US2014/048770 dated Oct. 22, 2014.
U.S. Appl. No. 14/050,525, filed Oct. 20, 2013, Dorfman et al.
U.S. Appl. No. 14/175,085, filed Feb. 7, 2014, Dorfman et al.
U.S. Appl. No. 14/220,255, filed Mar. 20, 2014, Dorfman.
U.S. Appl. No. 14/324,760, filed Jul. 7, 2014, Dorfman.

* cited by examiner

*Primary Examiner* — Vu A Nguyen

(57) ABSTRACT

This invention is directed to a polymer thick film white reflective flexible dielectric composition comprising urethane resin, thermoplastic phenoxy resin, and white reflective powder. Dielectrics made from the composition can be used in various electronic applications to protect electrical elements and particularly to reflect light in 3D circuits containing LED's.

4 Claims, No Drawings

ID OF THE INVENTION

This invention is directed to a polymer thick film white reflective flexible dielectric composition. Dielectrics made from the composition can be used in various electronic applications to protect electrical elements and particularly to provide reflectance to maximize LED lighting.

BACKGROUND OF THE INVENTION

Dielectrics have long been used to protect electrical elements. They have also been used as isolating layers. Although they have been used for years in these types of applications, the use of dielectrics as reflective elements is not common. This is particularly important in circuits containing LED lighting where one wants to maximize the available brightness through reflectivity. Additionally, more and more circuitry is being developed where the base substrate that the LED's are attached to needs to be bent and shaped in a non-planar fashion. Thus, the white reflective dielectric must also be flexible i.e., it must withstand a 90 degree bend with no cracking. One of the purposes of this invention is to alleviate this issue and produce a flexible reflective construction in which the light generated from LED's can be maximized.

SUMMARY OF THE INVENTION

This invention relates to a polymer thick film white reflective flexible dielectric composition comprising:
(a) 15-50 wt % of a first organic medium comprising 10-50 wt % urethane resin dissolved in 50-90 wt % first organic solvent, wherein the weight percent of the urethane resin and the first organic solvent are based on the total weight of the first organic medium;
(b) 15-50 wt % of a second organic medium comprising 10-50 wt % thermoplastic phenoxy resin dissolved in 50-90 wt % second organic solvent wherein the weight percent of the thermoplastic
(c) phenoxy resin and the second organic solvent are based on the total weight of the second organic medium; and
(d) 1-70 wt % of a white reflective powder;
wherein the weight percent of the first organic medium, the second organic medium and the white reflective powder are based on the total weight of the composition.

The invention is further directed to using the white reflective flexible dielectric to form a protective and/or insulating layer in electrical circuits.

DETAILED DESCRIPTION OF INVENTION

The invention relates to a polymer thick film white reflective flexible dielectric composition for use in electrical circuits.

The substrate commonly used in the types of circuits considered here is usually polyimide or a polyimide laminate construction such as DuPont™ CooLam® (DuPont Co., Wilmington, Del.). DuPont™ CooLam® is used for thermal conductivity purposes when high-brightness LED's are present. Further, DuPont™ CooLam® 3D (DuPont Co., Wilmington, Del.) is used for circuits which are non-planar.

The polymer thick film white reflective flexible dielectric composition can also be used in thermoforming electrical circuits, e.g., capacitive switch circuits. The substrate commonly used in polymer thick film thermoformable capacitive circuits is polycarbonate (PC). PC is generally preferred since it can be readily thermoformed. However, PC is very sensitive to the solvents used in the layers deposited on it. An inappropriate solvent can and will cause cracking or crazing in the PC substrate. In the course of producing a 3-dimensional capacitive circuit, after the thermoforming step, the final step will often be a molding step in which the finished circuit is formed by injection molding using a resin such as polycarbonate. This process is referred to as in-molding and involves higher temperatures. Depending on the resin chosen, these temperatures can typically exceed 250° C. for 10-30 sec. Thus the choice of the resins used in the PTF composition is critical. The combination of the resins used in the instant PTF composition has been shown to survive the in-mold process and produce fully functional circuitry whereas most resins typically used in PTF compositions will not.

The polymer thick film (PTF) white reflective flexible dielectric composition is comprised of (i) two organic mediums comprising two polymer resins dissolved in a first organic solvent and a second organic solvent, respectively, and (ii) white reflective powder. Additionally, powders and printing aids may be added to improve the composition. Herein weight percent will be written as wt %.

Organic Medium

The first organic medium is comprised of a urethane elastomer resin dissolved in a first organic solvent. The urethane resin must help achieve good adhesion to the underlying substrate. The urethane elastomer must also provide flexibility for the required bending of the circuit. It must be compatible with and not adversely affect the performance of the electrical element.

In one embodiment the urethane resin is 10-50 wt % and the first organic solvent is 50-90 wt % of the total weight of the first organic medium. In another embodiment the urethane resin is 25-45 wt % and the first organic solvent is 55-75 wt % of the total weight of the first organic medium. In still another embodiment the urethane resin is 15-25 wt % and the first organic solvent is 75-85 wt % of the total weight of the first organic medium. In one embodiment the urethane resin is a urethane elastomer. In another embodiment urethane resin is a polyester-based copolymer.

The second organic medium is composed of a phenoxy resin dissolved in a second organic solvent that may be the same as the first organic solvent. Different solvents may also be used. The phenoxy resin adds high temperature capability to the composition which aids in the use of this dielectric as a solder mask if required, and also improves moisture permeability. That is, it helps impede the progress of moisture through the composition. In one embodiment the phenoxy resin is 10-50 wt % and the second organic solvent is 50-90 wt % of the total weight of the second organic medium. In another embodiment the phenoxy resin is 20-35 wt % and the second organic solvent is 65-80 wt % of the total weight of the second organic medium.

In one embodiment, each medium is 15-50 wt % based on the total weight of the composition. In another embodiment, each medium is 15-40 wt % based on the total weight of the composition. In still another embodiment, the first organic medium is 15-25 wt % and the second organic medium is 25-45 wt % based on the total weight of the composition.

Although the preparation of two separate organic media are preferred, if the same solvent is to be used for both media a single organic medium equivalent to the two organic media described above may be used.

The polymer resin is typically added to the organic solvent by mechanical mixing to form the medium. Solvents suitable for use in the polymer thick film composition are recognized by one of skill in the art and include acetates and terpenes such as carbitol acetate and alpha- or beta-terpineol or mixtures thereof with other solvents such as kerosene, butyl carbitol, butyl carbitol acetate, hexylene glycol and high boiling alcohols and alcohol esters. In addition, volatile liquids for promoting rapid hardening after application on the substrate may be included. In many embodiments of the present invention, solvents such as glycol ethers, ketones, esters and other solvents of like boiling points (in the range of 180° C. to 250° C.), and mixtures thereof may be used. Various combinations of these and other solvents are formulated to obtain the viscosity and volatility requirements desired. The solvents used must solubilize the resin.

White Reflective Powder

The white reflective powder includes such powders as titanium dioxide, barium titanate, alumina, or mixtures thereof. In one embodiment, the amount of white reflective powder is 1-70% of the total weight of the entire composition. In another embodiment the white reflective powder is 20-60 wt % of the total weight of the entire composition and in still another embodiment the white reflective powder is 30-55 wt % of the total weight of the entire composition. In one embodiment the powder is titanium dioxide.

It is preferable to keep the particle size of the reflective powder in the range of 0.3-5 microns so as to avoid any cracking issues.

Additional Powders

Various powders may be added to the PTF dielectric composition to improve adhesion, modify the rheology and increase the low shear viscosity thereby improving the printability. One such powder is fumed silica where it has been found to significantly improve the resistance to moisture penetration.

Application of the PTF White Reflective Flexible Dielectric Composition

The PTF white reflective flexible dielectric composition, also referred to as a "paste", is typically deposited on a substrate, such as polyimide or a laminate of polyimide, such as DuPont™ CooLam® 3D, that is somewhat impermeable to gases and moisture. In other constructions, the white reflective flexible dielectric may be deposited over an existing silver/dielectric construction.

The deposition of the PTF white reflective flexible dielectric composition is performed typically by screen printing, but other deposition techniques such as stencil printing, syringe dispensing or coating techniques can be utilized. In the case of screen-printing, the screen mesh size controls the thickness of the deposited thick film.

Generally, a thick film composition comprises a functional phase that imparts appropriate functional properties to the composition. The functional phase comprises functional powders dispersed in an organic medium that acts as a carrier for the functional phase. Generally, the composition is fired to burn out both the polymer and the solvent of the organic medium and to impart the electrically functional properties. However, in the case of a polymer thick film, the polymer portion of the organic medium remains as an integral part of the composition after drying.

The PTF white reflective flexible dielectric composition is processed for a time and at a temperature necessary to remove all solvent. For example, the deposited thick film is dried by exposure to heat at 130° C. for typically 10-15 min.

Circuit Construction

The substrate used is typically polyimide-based as further processing steps involve exposure to soldering temperatures. The white reflective flexible dielectric is printed and dried as per the conditions described above. Several layers can be printed and dried. A subsequent step which may include bending of the entire unit is typical in the production of 3D circuits with as much as a 90 degree bend required. In one embodiment, the circuit is used as a solder mask.

EXAMPLE AND COMPARATIVE EXPERIMENT

Example 1

The PTF white reflective flexible dielectric composition was prepared in the following manner. The first organic medium was prepared by mixing 20.0 wt % Desmocoll 540 polyurethane (Bayer MaterialScience LLC, Pittsburgh, Pa.) with 80.0 wt % dibasic esters (DuPont Co., Wilmington, Del.) organic solvent. The molecular weight of the resin was approximately 40,000. This mixture was heated at 90° C. for 1-2 hours to dissolve all the resin. The second organic medium was prepared by adding 27.0 wt % PKHH (phenoxy) resin (InChem Corp.) to 73.0 wt % dibasic esters and heating as above. The above weight percent are based on the total weight of each of the media, respectively. All following weight percent are based on the total weight of the PTF white reflective flexible dielectric composition. 40.0 wt % titanium dioxide powder (DuPont Co., Wilmington, Del.) was then added as the white reflective powder and the entire composition was mixed. The composition was then subjected to the three-roll-mill for two cycles at 150 psi.

The composition, based on the total weight of the composition, was:

| | |
|---|---|
| 25.0 wt % | First Organic Medium |
| 35.0 wt % | Second Organic Medium |
| 40.0 wt % | Titanium Dioxide Powder |

A circuit was then fabricated as follows: On a DuPont™ CooLam® 3D substrate, a blanket print of the white reflective flexible dielectric composition prepared as described above was printed with a 200 stainless steel screen and dried at 130° C. for 10 min. A second print of the composition was then printed and dried. The part was inspected and no evidence of crazing or deformation of the underlying substrate was found. The circuit was then subjected to a 90 degree bend and tested for cracking/adhesion. No visible signs of cracking were detected, and adhesion before and after the bend was outstanding (5B on ASTM Tape Test). Reflectivity was measured at 90%.

Comparative Experiment A

A circuit was produced exactly as described in Example 1. The only difference was that the white reflective flexible dielectric composition was not used. Instead, a standard PTF dielectric, DuPont 5036 (DuPont Co., Wilmington, Del.), was used. Here, cracking and adhesion loss was observed after the 90 degree bending. Additionally, reflectivity was only 30%.

What is claimed is:

1. A polymer thick film white reflective flexible dielectric composition consisting essentially of:
   (a) 15-25 wt % of a first organic medium consisting of 15-25 wt % urethane resin dissolved in 75-85 wt % first organic solvent, wherein the weight percent of said urethane resin and said first organic solvent are based on the total weight of said first organic medium;
   (b) 25-45 wt % of a second organic medium consisting of 20-35 wt % thermoplastic phenoxy resin dissolved in 65-80 wt % second organic solvent wherein the weight percent of said thermoplastic phenoxy resin and said second organic solvent are based on the total weight of said second organic medium; and (c) 20-60 wt % of a white reflective powder selected from the group consisting of titanium dioxide, barium titanate, and mixtures thereof;

wherein the weight percent of said first organic medium, said second organic medium and said white reflective powder are based on the total weight of said composition.

2. The polymer thick film white reflective flexible dielectric composition of claim 1, wherein said urethane resin is a urethane elastomer or a polyester-based copolymer.

3. The polymer thick film white reflective flexible dielectric composition of claim 2, wherein said urethane resin is a polyester-based copolymer.

4. The polymer thick film white reflective flexible dielectric composition of claim 1, wherein said white reflective powder is titanium dioxide.

* * * * *